United States Patent
Sekiguchi et al.

(10) Patent No.: US 10,878,898 B2
(45) Date of Patent: Dec. 29, 2020

(54) MEMORY SYSTEM AND METHOD OF CONTROLLING MEMORY SYSTEM FOR CALCULATING VOLTAGE VALUE FOR READING DATA

(71) Applicant: Toshiba Memory Corporation, Tokyo (JP)

(72) Inventors: Ryo Sekiguchi, Tokyo (JP); Shingo Yanagawa, Kanagawa (JP); Yasuhiko Kurosawa, Kanagawa (JP); Eriko Akaihata, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 2 days.

(21) Appl. No.: 16/291,271

(22) Filed: Mar. 4, 2019

(65) Prior Publication Data

US 2020/0090742 A1  Mar. 19, 2020

(30) Foreign Application Priority Data

Sep. 14, 2018 (JP) .................................. 2018-172796

(51) Int. Cl.
*G11C 16/26* (2006.01)
*G11C 11/56* (2006.01)
*G11C 13/00* (2006.01)
*G11C 16/34* (2006.01)

(52) U.S. Cl.
CPC ...... *G11C 11/5642* (2013.01); *G11C 11/5628* (2013.01); *G11C 13/004* (2013.01); *G11C 16/34* (2013.01)

(58) Field of Classification Search
CPC ..... G11C 16/26; G11C 16/34; G11C 16/3404; G11C 16/3413; G11C 16/3418; G11C 16/3436
See application file for complete search history.

(56) References Cited

U.S. PATENT DOCUMENTS

| | | | |
|---|---|---|---|
| 9,361,996 B2 | 6/2016 | Shen et al. | |
| 2004/0255090 A1* | 12/2004 | Guterman | G11C 16/349 711/156 |
| 2011/0317488 A1* | 12/2011 | Tseng | G11C 11/5628 365/185.09 |
| 2013/0148436 A1 | 6/2013 | Kurosawa | |

FOREIGN PATENT DOCUMENTS

JP  2006-031755 A  2/2006

* cited by examiner

*Primary Examiner* — Alfredo Bermudez Lozada
(74) *Attorney, Agent, or Firm* — Kim & Stewart LLP

(57) ABSTRACT

A memory system includes a first memory, a second memory, and a first circuit. The first memory includes a memory cell array including memory cell transistors, and a peripheral circuit configured to read data of a plurality of bits stored in a memory cell transistor of the memory cell array based on a comparison between threshold voltages of the memory cell transistor and at least a part of n determination voltages ($n \geq 3$). The first circuit is configured to calculate an estimated value of each of n−m determination voltages based on values of m determination voltages ($2 \leq m \leq n-1$) among the n determination voltages, and calculate a difference between a value of each of the n−m determination voltages and a corresponding estimated value. The second memory is configured to store values of the m determination voltages and the difference for each of the n−m determination voltages.

18 Claims, 10 Drawing Sheets

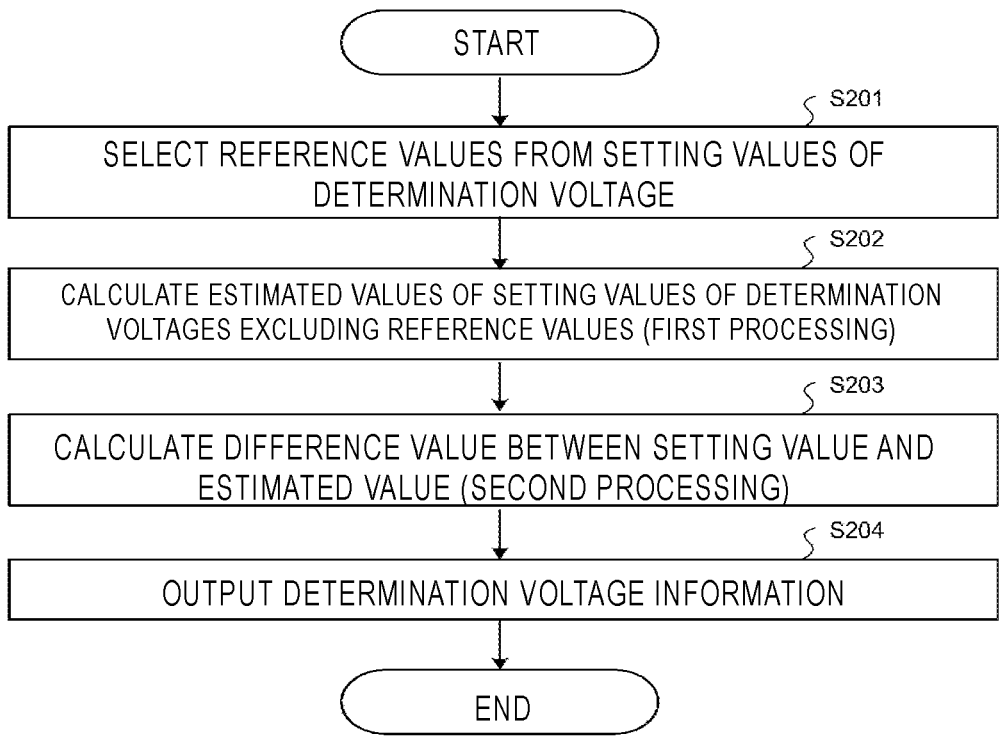
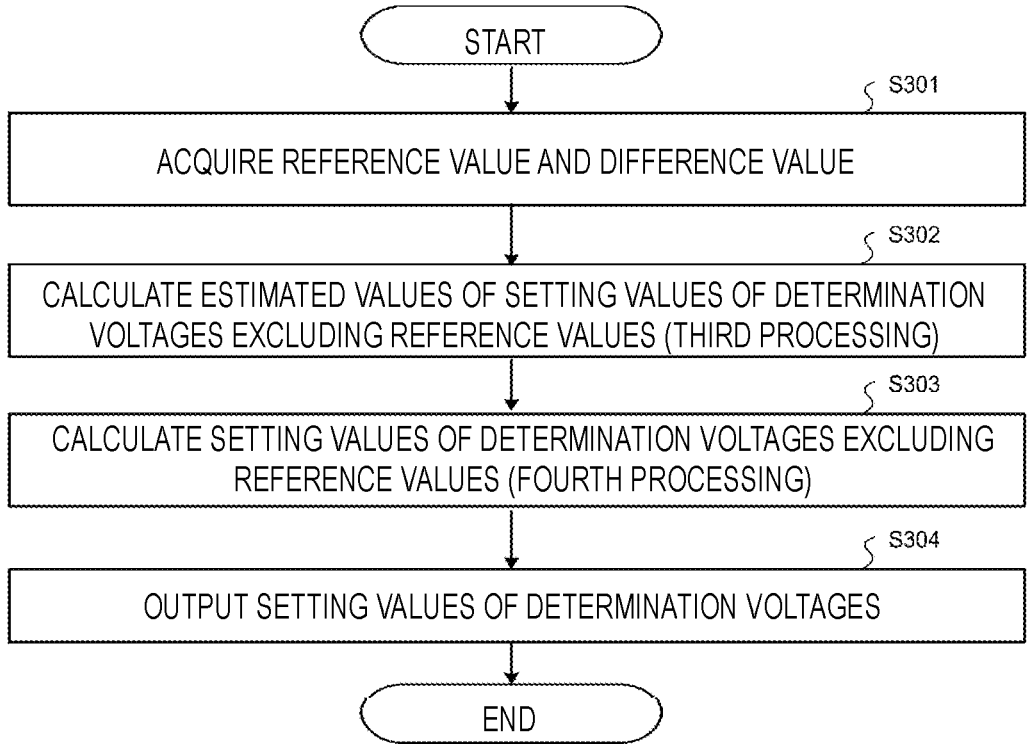

MEMORY SYSTEM AND METHOD OF CONTROLLING MEMORY SYSTEM FOR CALCULATING VOLTAGE VALUE FOR READING DATA

CROSS-REFERENCE TO RELATED APPLICATION

This application is based upon and claims the benefit of priority from Japanese Patent Application No. 2018-172796, filed on Sep. 14, 2018, the entire contents of which are incorporated herein by reference.

FIELD

Embodiments described herein relate generally to a memory system and a method of controlling the memory system.

BACKGROUND

In the related art, memory systems having memory cell transistors are widely known. In such memory systems, based on a comparison between a threshold voltage of a memory cell transistor and a determination voltage, read processing is performed to determine a value of data stored in the memory cell transistor.

The threshold voltage of the memory cell transistor may vary according to use situations. As a result, a data determination error (bit error) may occur. As a countermeasure against the bit error, a memory system is configured so that a setting value of the determination voltage may be changed.

For example, when a bit error occurs, the memory system corrects data corrupted by the bit error using an error correction function. When the correct data cannot be obtained even by using the error correction function, the memory system may obtain a value of the determination voltage that makes it possible to obtain the correct data by using the error correction function and may execute the read processing by using the obtained value as the determination voltage.

When the value of the determination voltage that makes it possible to obtain the correct data by using the error correction function is stored so that the stored value may be used in the next read processing, the number of times of the process of obtaining the determination voltage value can be reduced.

DESCRIPTION OF THE DRAWINGS

FIG. 7 is a flowchart illustrating an example of a procedure of compression processing according to the first embodiment.

FIG. 8 is a flowchart illustrating an example of a procedure of decompression processing according to the first embodiment.

DETAILED DESCRIPTION

One or more embodiments provide a memory system capable of efficiently storing a value of a determination voltage.

In general, according to an embodiment, a memory system includes a first memory, a second memory, and a first circuit. The first memory includes a memory cell array including memory cell transistors, and a peripheral circuit configured to read data of a plurality of bits stored in a memory cell transistor of the memory cell array based on a comparison between threshold voltages of the memory cell transistor and at least a part of n determination voltages (n≥3). The first circuit is configured to calculate an estimated value of each of n−m determination voltages based on values of m determination voltages (2≤m≤n−1) among the n determination voltages, and calculate a difference between a value of each of the n−m determination voltages and a corresponding estimated value. The second memory stores values of the m determination voltages and the difference for each of the n−m determination voltages.

Hereinafter, a memory system and a method of controlling the memory system according to embodiments will be described in detail with reference to the accompanying drawings. The present disclosure is not limited by these embodiments.

First Embodiment

Figure 1:
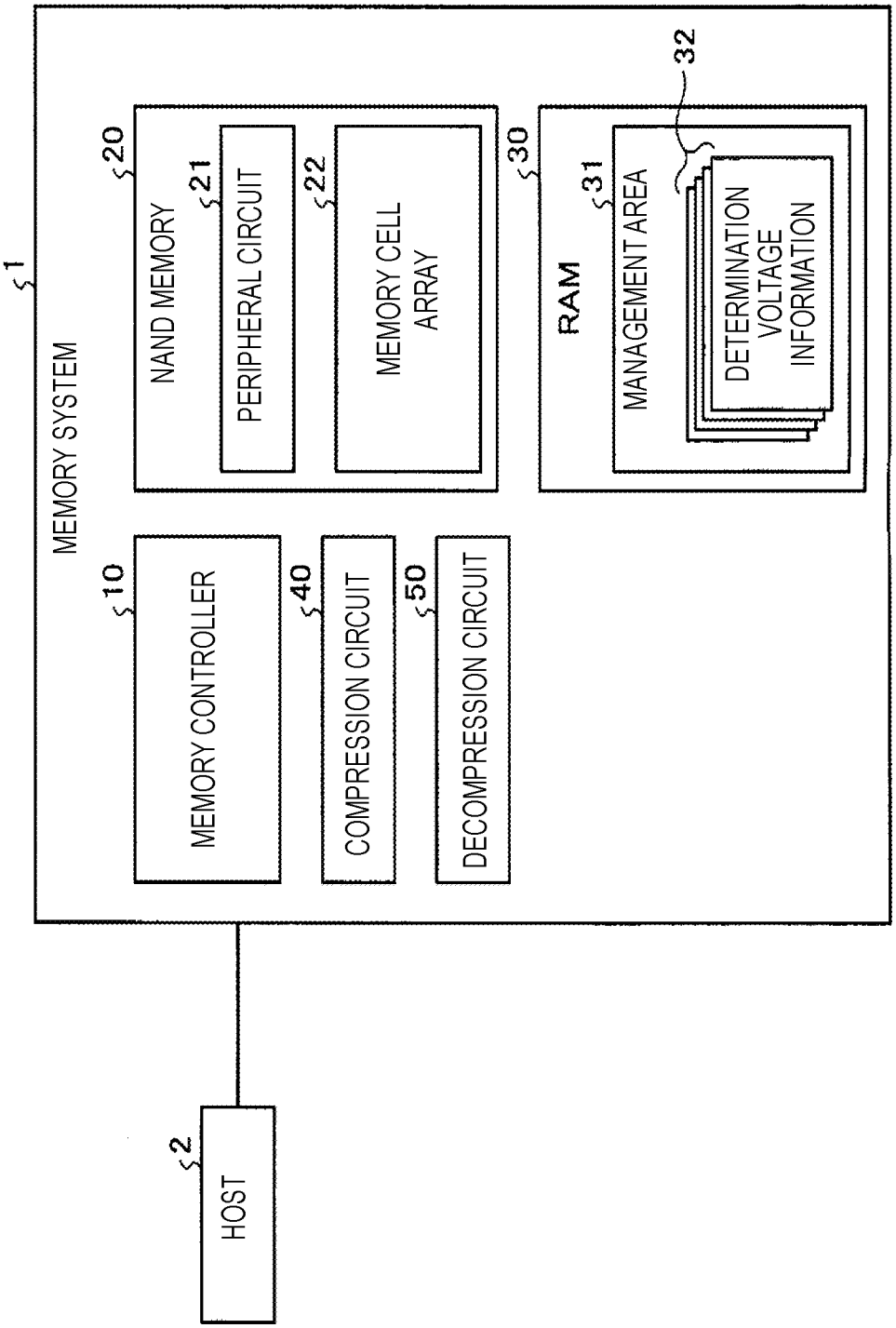
FIG. 1 illustrates a configuration example of a memory system according to a first embodiment.

FIG. 1 is a diagram illustrating a configuration example of a memory system according to a first embodiment. The memory system 1 is connected to a host 2 via a predetermined communication interface. The host 2 corresponds to, for example, a personal computer, a portable information terminal, a server, or the like.

The memory system 1 receives access requests (read request and write request) from the host 2. The memory system 1 receives data to be written, together with the write request.

The memory system 1 includes a memory controller 10, a NAND type flash memory (NAND memory) 20, and a RAM (Random Access Memory) 30.

The NAND memory 20 is nonvolatile memory and is an example of first memory of the embodiments. The NAND memory 20 includes a peripheral circuit 21 and a memory cell array 22.

The memory cell array 22 includes plural blocks, each of which is a group of plural nonvolatile memory cell transistors (memory cells). All data stored in one block are erased in one operation.

The peripheral circuit 21 includes, for example, a row decoder, a column decoder, a sense amplifier, a latch circuit, and a voltage generation circuit. Upon receiving a command from the memory controller 10, the peripheral circuit 21 executes processing corresponding to the command among program processing, read processing, and erase processing for the memory cell array 22.

Figure 2:
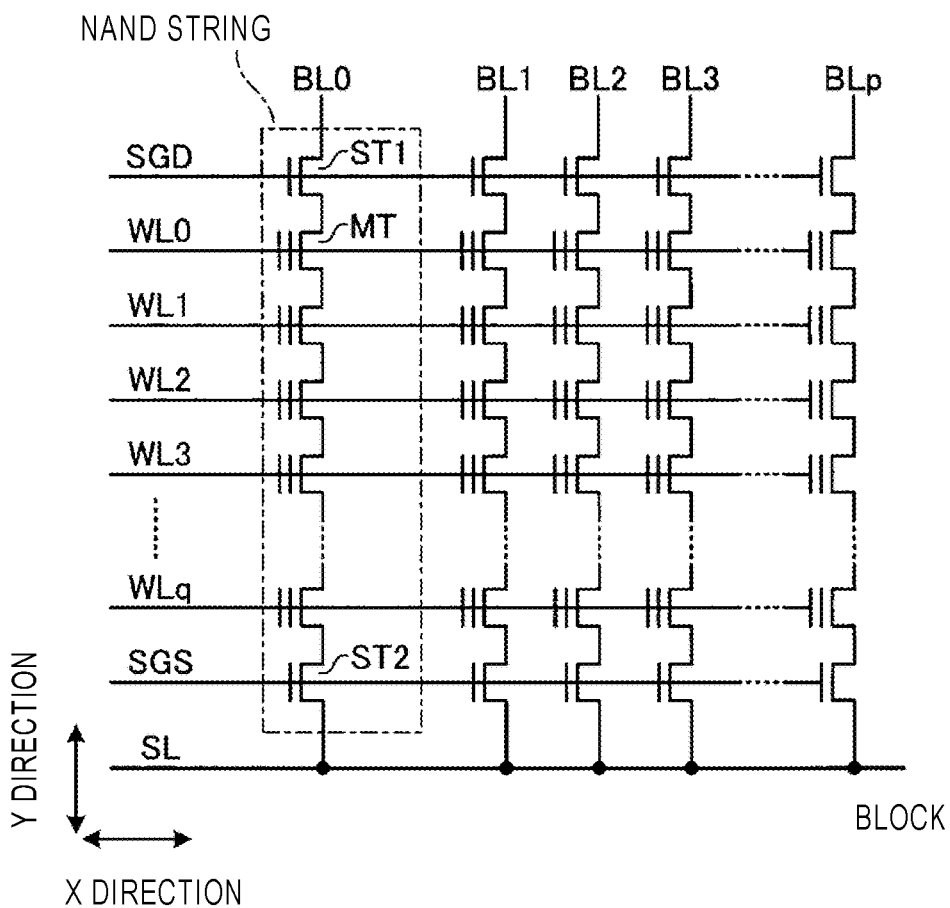
FIG. 2 is a circuit diagram illustrating a configuration example of one block in a memory cell array in the first embodiment.

FIG. 2 is a circuit diagram illustrating a configuration example of one block in the memory cell array 22 in the first embodiment. As illustrated in FIG. 2, each block includes (p+1) NAND strings arranged in order along the X direction (p≥0). A select transistor ST1 included in each of the (p+1) NAND strings includes a drain connected to bit lines BL0 to BLp and a gate commonly connected to a select gate line SGD. In addition, a select transistor ST2 includes a source commonly connected to a source line SL and a gate commonly connected to a select gate line SGS.

Each memory cell MT includes a MOSFET (Metal Oxide Semiconductor Field Effect Transistor) having a stacked gate structure formed on a semiconductor substrate. The stacked gate structure includes a floating gate formed on the semiconductor substrate with a tunnel oxide film interposed therebetween, and a control gate electrode formed on the floating gate with an inter-gate insulating film interposed therebetween. The threshold voltage changes depending on the number of electrons stored in the floating gate. The memory cell MT stores data according to a difference in threshold voltage. That is, the memory cell MT holds an amount of charge corresponding to the data in the floating gate.

In each NAND string, (q+1) memory cells MT are arranged such that respective current paths are connected in series between the source of the select transistor ST1 and the drain of the select transistor ST2 (q≥0). Control gate electrodes are respectively connected to word lines WL0 to WLq in order from the memory cell MT located closest to the drain side. Therefore, the drain of the memory cell MT connected to the word line WL0 is connected to the source of the select transistor ST1, and the source of the memory cell MT connected to the word line WLq is connected to the drain of the select transistor ST2.

The word lines WL0 to WLq commonly connect to each control gate electrode of each of the memory cells MT over the NAND strings in the block, respectively. That is, the control gate electrodes of the memory cells MT in the same row in the block are connected to the same word line WL. When each memory cell MT is configured to be able to store a 1-bit value, (p+1) memory cells MT connected to the same word line WL are handled as one page, and program processing and read processing are performed for each page.

Data of plural bits may be stored in each memory cell MT. For example, when each memory cell MT may store data of n (n≥2) bits, the storage capacity per word line is equal to the size of n pages.

The number of bits of data stored in each memory cell MT is not limited to a specific number. Here, descriptions will be made for a case where a scheme called TLC (Triple Level Cell) in which 3-bit data is stored in each memory cell MT is adopted.

Figure 3:
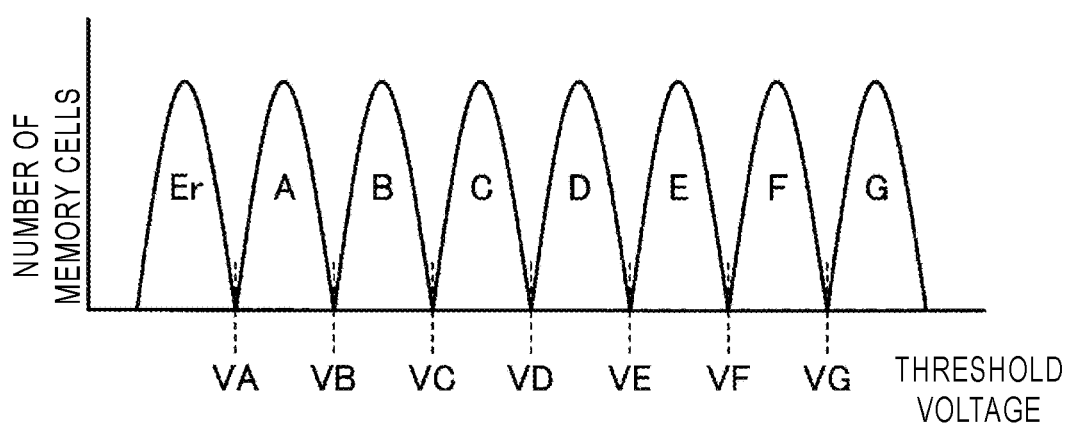
FIG. 3 illustrates a distribution of threshold voltages that may be taken by memory cells MT in the first embodiment.

FIG. 3 is a diagram illustrating a distribution of threshold voltages that may be taken by a memory cell MT in the first embodiment. In FIG. 3, the horizontal axis represents the threshold voltage and the vertical axis represents the number of memory cells.

When data are written in a memory cell MT, the threshold voltage of the memory cell MT is controlled so as to fall within any of eight distributions: a distribution Er, a distribution A, a distribution B, a distribution C, a distribution D, a distribution E, a distribution F, and a distribution G. The distribution Er, the distribution A, the distribution B, the distribution C, the distribution D, the distribution E, the distribution F, and the distribution G are in the one-to-one correspondence to "111", "110", "100", "000", "010", "011", "001", and "101", respectively. As a result, the memory cell MT may store 3-bit data. The data associated with each distribution is not limited thereto.

The distribution Er corresponds to a state in which data of the memory cell MT is erased. That is, the threshold voltage of the memory cell MT after the erase processing is executed by the peripheral circuit 21 falls within the distribution Er. The threshold voltage of the memory cell MT is maintained within the distribution Er or increased to a distribution corresponding to data in the distributions A to G by the program processing executed by the peripheral circuit 21.

A determination voltage for read processing is set between two adjacent distributions. For example, as illustrated in FIG. 3, a determination voltage VA is set between the distribution Er and the distribution A, a determination voltage VB is set between the distribution A and the distribution B, a determination voltage VC is set between the distribution B and the distribution C, a determination voltage VD is set between the distribution C and the distribution D, a determination voltage VE is set between the distribution D and the distribution E, a determination voltage VF is set between the distribution E and the distribution F, and a determination voltage VG is set between the distribution F and the distribution G.

In the read processing, the peripheral circuit 21 specifies a distribution to which the threshold voltage of each memory cell MT belongs, based on a comparison between the threshold voltage and the determination voltages VA to VG. Then, the peripheral circuit 21 decodes the specified distribution into data having a value corresponding to the distribution, and transmits the data obtained by the decoding to the memory controller 10.

When only a specific bit among the 3-bit data is subjected to the read processing, the peripheral circuit 21 may determine the data of the specific bit by using only some of the determination voltages VA to VG. That is, the peripheral circuit 21 may determine the data stored in the memory cell MT by using a portion or all of the determination voltages VA to VG.

Here, as described above, the threshold voltage of the memory cell MT may change according to use situations. When a portion or all of the distributions of the threshold voltage exceeds a determination voltage which needs to be at the boundary between distributions, data erroneous determination occurs. That is, a bit error that data different from written data is read out occurs.

The memory controller 10 copes with the bit error by error correction and determination voltage shift.

Specifically, the memory controller 10 executes error correction on the data acquired from the NAND memory 20. When the error correction is unsuccessful, the memory controller searches for the optimum values of the determination voltages VA to VG and sets the optimum values of the determination voltages VA to VG obtained by the search as new setting values of the determination voltages VA to VG to retry the read processing.

Here, the optimum values of the determination voltages VA to VG are values of the determination voltages VA to VG that may make a bit error occurrence rate as small as possible. The optimum values of the determination voltages VA to VG need not be necessarily optimum values, for example values that minimize the bit error occurrence rate. In the present embodiment and embodiments to be described below, the values of the determination voltages VA to VG that may make the bit error occurrence rate as small as possible are searched by a predetermined method. The values of the determination voltages VA to VG obtained by the search are defined as the optimum values of the determination voltages VA to VG.

The memory controller 10 sets the optimum values of the determination voltages VA to VG as new setting values of the determination voltages VA to VG and executes the error correction on the data obtained by the retried read processing. When the error correction is successful, the memory controller 10 stores the new setting values of the determination voltages VA to VG in a management area 31 set in the RAM 30 and uses the stored new setting values to execute the next read processing.

As a result, the number of times of execution of a process of searching for the optimum values of the determination voltages VA to VG may be reduced. For example, when the memory controller 10 executes the read processing plural times for the same portion of the memory cell MT, by acquiring and storing the searched optimum values of the determination voltages VA to VG, it is possible to omit the searching process in each of the plural read processes. That is, the execution speed of the read processing may be improved by as much as the time required for searching for the optimum values of the determination voltages VA to VG.

The method of searching for the optimum values of the determination voltages VA to VG is not limited to a specific method. In one example, the memory controller 10 may search for the optimum values of the determination voltages VA to VG by distribution read. The distribution read is a process of measuring a distribution of threshold voltages.

In the distribution read, one determination voltage is used to determine whether each memory cell MT is in an ON state or an OFF state. The read processing is executed plural times while the value of the determination voltage is being changed by a predetermined pitch width. In each read processing, the number of memory cells in an ON state or OFF state (predetermined state) is acquired for each value used as the determination voltage. Then, for example, based on the number of memory cells in the predetermined state, a distribution of threshold voltages having eight lobes as illustrated in FIG. 3 is obtained.

When the distribution of threshold voltages having eight lobes is obtained by the distribution read, seven voltage values having the minimum number of memory cells are determined as the optimum values of the determination voltages VA to VG.

The constituent elements that execute the distribution read are not limited to specific constituent elements. For example, the memory controller 10 may instruct the peripheral circuit 21 to perform the plural read processes sequentially in which the value of the determination voltage is gradually varied, and may count the number of memory cells in the predetermined state based on the data obtained from each of the plural read processes.

Alternatively, when the peripheral circuit 21 has a function of executing the distribution read, the memory controller 10 may instruct the peripheral circuit 21 to execute the distribution read, and the peripheral circuit 21 may obtain the optimum values of the determination voltages VA to VG from the distribution of the threshold voltages obtained by the distribution read and may transmit the obtained optimum values of the determination voltages VA to VG to the memory controller 10.

The method of searching for the optimum values of the determination voltages VA to VG is not limited to the distribution read only. For example, the plural read processes may be executed while changing the values of the determination voltages VA to VG little by little, the number of bit errors may be counted in each of the plural read processes. Then, the values of the determination voltages VA to VG used in read processing in which the count value of the bit error is minimum among the plural read processes may be determined as the optimum values of the determination voltages VA to VG.

Referring back to FIG. 1, the RAM 30 is volatile memory and is an example of second memory of the embodiment. The RAM 30 includes, for example, a DRAM (Dynamic Random Access Memory), a SRAM (Static Random Access Memory), or a combination thereof. The type of memory constituting the volatile memory is not limited thereto. The memory system 1 may include any type of memory instead of the RAM 30.

The RAM 30 includes a management area 31 that is an area in which the optimum values of the determination voltages are stored.

As described above, a set of seven determination voltages VA to VG is used in the case of the TLC method. Therefore, when storing the optimum values of the determination voltages as they are, the size of information to be stored becomes large.

In the embodiment, in order to keep small the size of information to be stored, the optimum values of the determination voltages are stored in the management area 31 in a compressed state. For this purpose, the memory system 1 includes a compression circuit 40 and a decompression circuit 50. Each of the compression circuit 40 and the decompression circuit 50 may be a processor such as a CPU (Central Processing Unit), or a hardware circuit such as a field-programmable gate array (FPGA) or an application specific integrated circuit (ASIC).

The compression circuit 40 is an example of a first circuit of the embodiment. The compression circuit 40 selects two of the optimum values of the determination voltages VA to VG as reference values, and executes first processing that includes calculating an estimated value for each of the five optimum values other than the reference values. Among the determination voltages VA to VG, the determination voltages of which optimum values are selected as the reference values are preset. The compression circuit 40 calculates the respective estimated values by interpolation between the reference values or extrapolation outside the range between the reference values. After the first processing, the compression circuit 40 executes second processing that includes calculating a difference value between the optimum value and the estimated value for each of the five optimum values other than the reference values.

Figure 4:
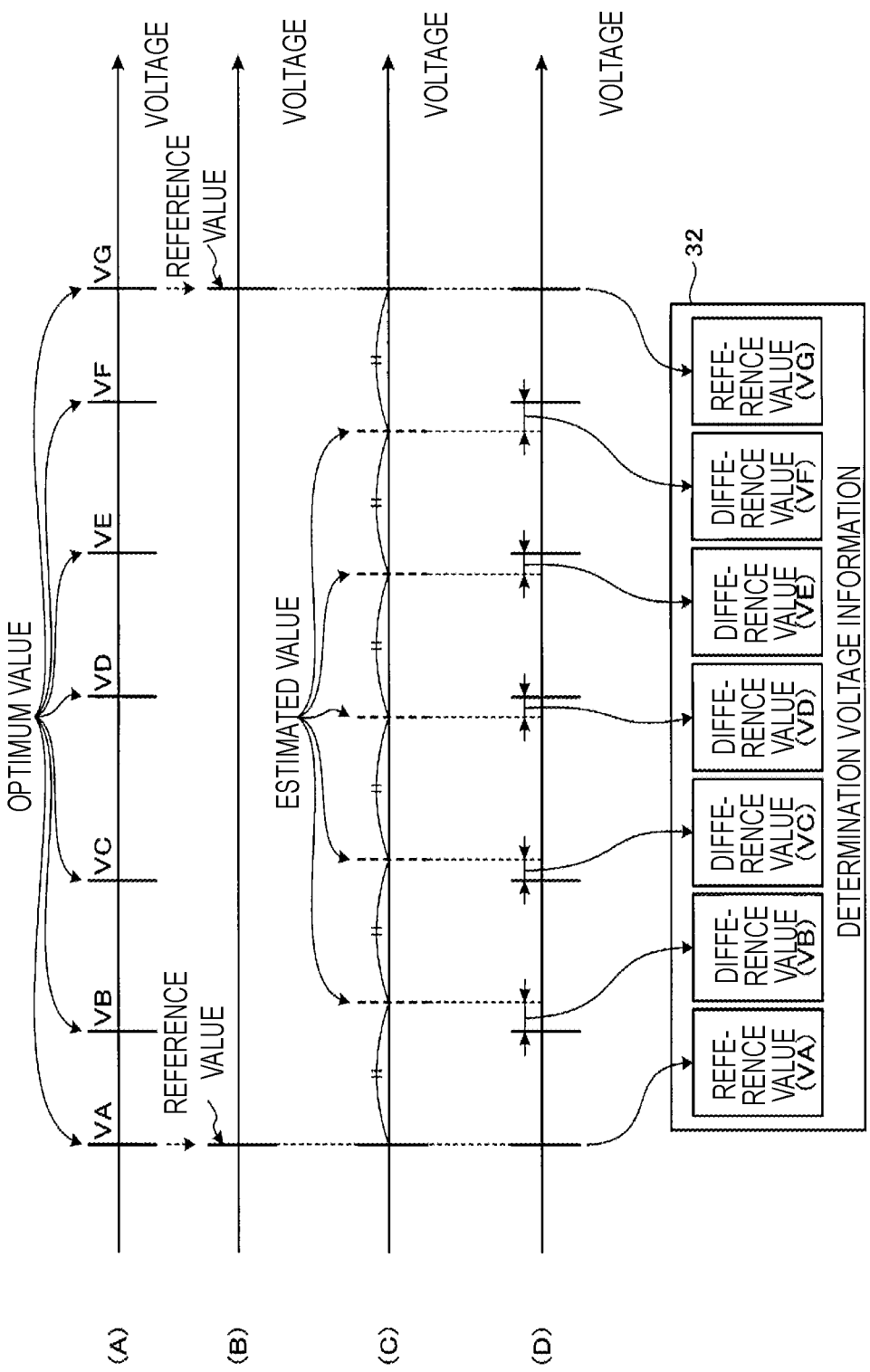
FIG. 4 is a diagram for explaining specific examples of first processing and second processing executed by a compression circuit in the first embodiment.

FIG. 4 is a diagram for explaining a specific example of the first processing and the second processing executed by the compression circuit 40 of the first embodiment. For example, the compression circuit 40 selects the optimum value of the determination voltage VA and the optimum value of the determination voltage VG as the reference values from the optimum values of the determination voltages VA to VG illustrated in part (A) of FIG. 4 (see part (B) of FIG. 4).

Then, the compression circuit 40 executes the first processing. Specifically, the compression circuit 40 calculates the estimated values of the optimum values of the determination voltages VB to VF by interpolating between the two reference values on the assumption that the optimum values of the determination voltages VA to VG are present at equal intervals (see part (C) of FIG. 4). That is, in this example, the compression circuit 40 calculates the estimated values of the optimum values of the determination voltages VB to VF by carrying out the linear interpolation between the two reference values.

Subsequently, the compression circuit 40 executes the second processing. Specifically, the compression circuit 40 calculates a difference value between the optimum value and the estimated value for each of the determination voltages VB to VF (see part (D) of FIG. 4). Then, the compression circuit 40 outputs information indicating the difference value between the two reference values, that is, between the optimum values of the determination voltages VA and VG, and the corresponding estimated value obtained for each of the determination voltages VB to VF as information indicating the optimum value of one set of determination voltages (denoted as determination voltage information 32).

For example, a case is considered where the respective values of the determination voltages VA to VG may be set within the range of 0 to 511 (9 bits) and the optimum values of the determination voltages VA to VG are set to {30, 90, 155, 235, 295, 370, 420}. According to the example of FIG. 4, the optimum value 30 of the determination voltage VA and the optimum value 420 of the determination voltage VG are respectively selected as the reference values. Then, by dividing the range of 30 to 420 by 6, 65 is obtained as the interval between estimated values. Then, by arranging the estimated values of the determination voltages VB to VF at intervals of 65, {95, 160, 225, 290, 355} is obtained as the estimated values of the determination voltages VB to VF. Then, by subtracting the estimated value from the optimum value for each of the determination voltages VB to VF, the difference values {−5, −5, 10, 5, 15} for the determination voltages VB to VF are obtained. Then, the optimum values {30, 420} of the determination voltages VA and VG as the reference values and the difference values {−5, −5, 10, 5, 15} for the determination voltages VB to VF are recorded in the determination voltage information 32 which is then output.

Since the respective values of the determination voltages VA to VG may be set within a range of 0 to 511 (9 bits), when storing the optimum values of the determination voltages VA to VG as they are, the size of information to be stored is 63 bits (=7*9 bits). In the meantime, the size of the difference value is within 5 bits. Therefore, it is possible to reduce the size of the determination voltage information 32 indicating the optimum values of the determination voltages VA to VG to 43 bits (=2*9 bits+5*5 bits).

In this way, according to the embodiment, each of the five optimum values except the reference values is stored as the difference value from the estimated value calculated based on the reference values. Therefore, it is possible to reduce the size of information to be stored, as compared with a case of storing the optimum values of the determination voltages VA to VG in the format of a direct value.

That is, the optimum values of the determination voltages VA to VG are compressed by the compression circuit 40 into the determination voltage information 32 of which size is smaller than the direct values of the optimum values of the determination voltages VA to VG.

The size allocated to store the difference value may or may not be fixed. According to the above example, a fixed 5-bit size is prepared as a size in which the difference value for each of the determination voltages VB to VF in the determination voltage information 32 is stored. That is, when the difference values for the determination voltages VB to VF are {−5, −5, 10, 5, 15}, each difference value is included in the determination voltage information 32 as data of size of 5 bits. When any one of the difference values for the determination voltages VB to VF exceeds 5 bits, the compression circuit 40 may clamp and store the difference value to the maximum value or the minimum value that may be expressed by the size of 5 bits (i.e., when a range to be expressed by 5 bits is from −16 to 15, the maximum value of 15 and or minimum value of −16).

The decompression circuit 50 is an example of a second circuit of the embodiment. The decompression circuit 50 restores the optimum values of the determination voltages VA to VG from the determination voltage information 32 by executing processing reverse to that of the compression circuit 40. That is, the decompression circuit 50 decompresses the determination voltage information 32 to the direct values of the optimum values of the determination voltages VA to VG.

Specifically, the decompression circuit 50 calculates the estimated value for each of the five optimum values other than the reference values by executing a third processing, which is the same processing as the first processing, using the two reference values included in the determination voltage information 32 stored in the management area 31. After the third processing, the decompression circuit 50 calculates the five optimum values other than the reference values based on the five difference values corresponding to the five optimum values other than the reference values included in the determination voltage information 32 and the five estimated values obtained by the third processing.

Figure 5:
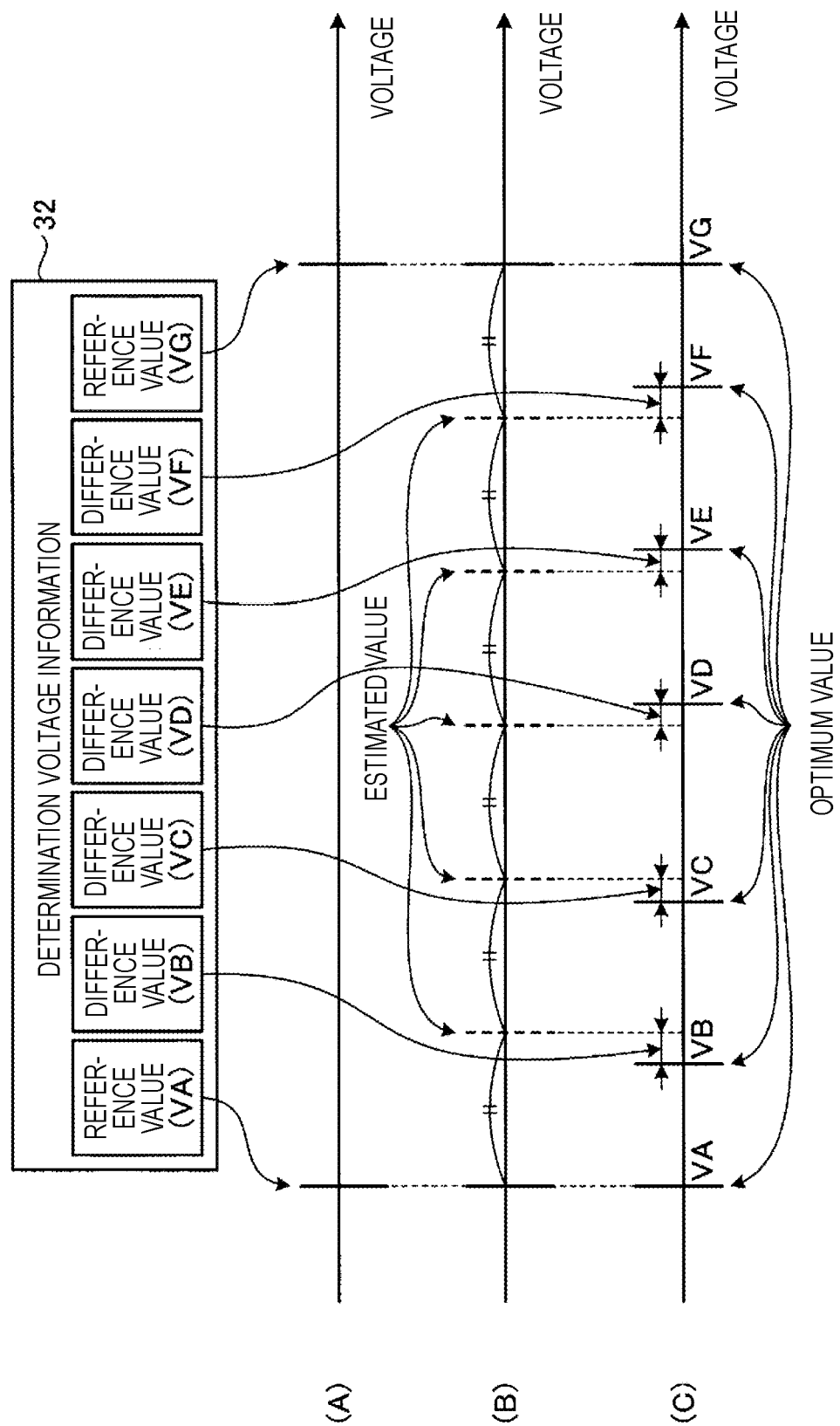
FIG. 5 is a diagram for explaining specific examples of third processing and fourth processing executed by a decompression circuit in the first embodiment.

FIG. 5 is a diagram for explaining specific examples of the third processing and fourth processing executed by the decompression circuit 50 of the first embodiment. First, the decompression circuit 50 acquires the optimum value of the determination voltage VA and the optimum value of the determination voltage VG included in the determination voltage information 32 as reference values (see part (A) of FIG. 5). The determination voltages of which optimum values are acquired as the reference values are the same as the determination voltages selected by the compression circuit 40.

Subsequently, the decompression circuit 50 calculates the estimated values of the optimum values of the determination voltages VB to VF in the same manner as the compression circuit 40 (third processing). That is, the decompression circuit 50 calculates the estimated values of the optimum values of the determination voltages VB to VF by interpolating between the two reference values on the assumption that the optimum values of the determination voltages VA to VG are present at equal intervals (see part (B) of FIG. 5).

Then, the decompression circuit 50 executes the fourth processing. Specifically, the decompression circuit 50 calculates the optimum value for each of the determination voltages VB to VF based on the estimated value and the difference value included in the determination voltage information 32 (see part (C) of FIG. 5). As a result, the decompression circuit 50 may obtain the optimum values of the determination voltages VA to VG. The decompression circuit 50 outputs the obtained optimum values of the determination voltages VA to VG.

For example, a case is considered where the optimum values of the determination voltages VA to VG are decompressed from the determination voltage information 32 in which the optimum values {30, 420} of the determination voltages VA and VG as the reference values and the difference values {−5, −5, 10, 5, 15} for the determination voltages VB to VF are recorded. Even during the decompression, as in the compression, the estimated values of the determination voltages VB to VF are calculated by linear interpolation based on the reference value {30, 420}. As a result, the same values {95, 160, 225, 290, 355} as in the compression are obtained as the estimated values of the determination voltages VB to VF. Then, by adding the difference values {−5, −5, 10, 5, 15} to {95, 160, 225, 290, 355}, the direct values {30, 90, 155, 235, 295, 370, 420} of the optimum values of the determination voltages VA to VG may be obtained.

The optimum values of the determination voltages VA to VG obtained by the search are used as new setting values of the determination voltages VA to VG in the retry of the read processing. After the error correction on the data read by the retry of the read processing is successful, the optimum values of the determination voltages VA to VG used as the setting values are compressed and stored.

Alternatively, the optimum values of the determination voltages VA to VG obtained by the search may first be compressed and stored. The stored optimum values of the determination voltages VA to VG may be decompressed and used for the read processing when the read processing is performed again.

In the following description, the optimum values of the determination voltages VA to VG compressed and stored in the management area 31 are written as setting values of the determination voltages VA to VG or new setting values of the determination voltages VA to VG in the sense that they are values used as the new setting values of the determination voltages VA to VG or values to be used later as the new setting values of the determination voltages VA to VG.

The determination voltage information 32 generated by the compression circuit 40 is stored in the management area 31. The decompression circuit 50 decompresses the determination voltage information 32 stored in the management area 31 to obtain the optimum values of the determination voltages VA to VG.

Plural pieces of determination voltage information 32 may be stored in the management area 31. For example, in a case where the memory system 1 is configured so that the setting value of one set of determination voltages is applied to each block, plural pieces of determination voltage information 32 to which different blocks are applied may be stored in the management area 31. The unit to which the setting value of the one set of determination voltages is applied is not limited to the block.

The memory controller 10 executes control of the memory system 1, including data transfer between the host 2 and the NAND memory 20. Specifically, the memory controller 10 instructs the peripheral circuit 21 to perform any one of the read processing, the program processing, and the erase processing in response to a request from the host 2 or an internal request of the memory system 1.

In addition, the memory controller 10 may execute error correction on data read from the NAND memory 20 (data acquired from the memory cell array 22 by the peripheral circuit 21 by the read processing).

For example, when sending data to the NAND memory 20, the memory controller 10 performs encoding for error correction on the data. That is, the encoded data is written in the memory cell array 22. When data is read from the NAND memory 20, the memory controller 10 detects a bit error included in the data by decoding the data (encoded data) read from the NAND memory 20. When a bit error is detected, the memory controller 10 corrects the data corrupted by the bit error to correct data.

Any method may be adopted as a method of encoding/decoding by the memory controller 10. For example, a BCH code, an LDPC (Low-Density Parity-Check) code, or the like may be adopted as a method of encoding/decoding by the memory controller 10. The memory controller 10 may have error correction functions of plural schemes having different correction capabilities.

The memory controller 10 may be configured as one SoC (System-on-a-Chip) or by plural chips. The memory controller 10 may include the RAM 30 therein.

Further, the memory controller 10 may include an FPGA or an ASIC in addition to or in place of the processor. That is, the memory controller 10 may be implemented by software, hardware, or a combination thereof.

Figure 6:
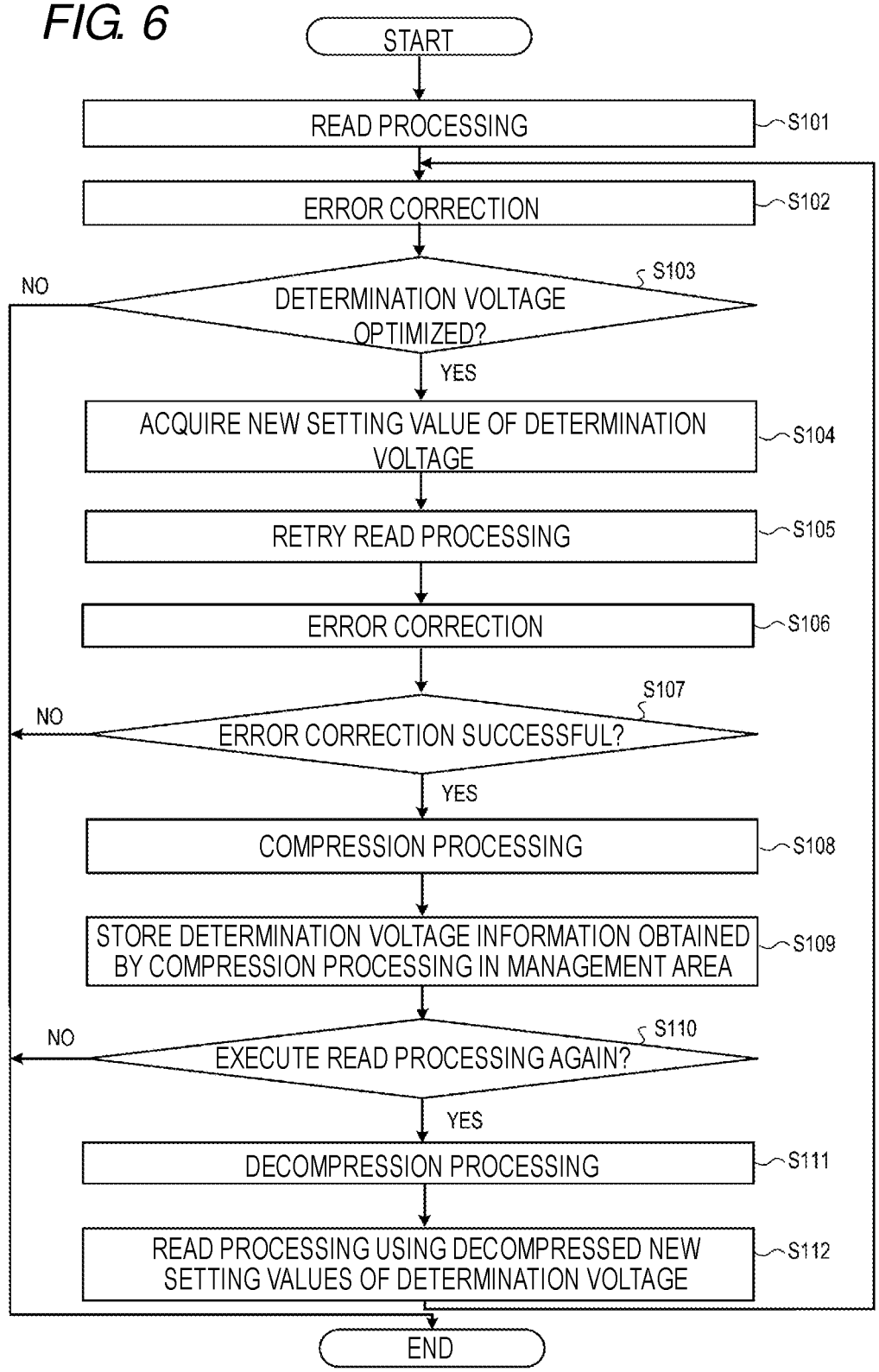
FIG. 6 is a flowchart illustrating a main operation of the memory system according to the first embodiment.

Next, the operation of the memory system 1 of the first embodiment will be described. FIG. 6 is a flowchart illustrating the main operation of the memory system 1 according to the first embodiment.

First, the memory controller 10 instructs the peripheral circuit 21 to execute the read processing (S101). In S101, the memory controller 10 may or may not designate the values of the determination voltages VA to VG. The peripheral circuit 21 uses values instructed from the memory controller 10 or predetermined values as the determination voltages VA to VG.

When the peripheral circuit 21 acquires data by the read processing, the memory controller 10 executes error correction on the data (S102). Then, based on the result of the error correction, the memory controller 10 determines whether to optimize the determination voltages (S103).

The criterion for determination in S103 is not limited to a specific criterion. For example, when the error correction is unsuccessful, the memory controller 10 may determine to optimize the determination voltages. When the error correction is successful, the memory controller 10 may determine not to optimize the determination voltages.

Alternatively, the memory controller 10 may store candidate values of plural sets of determination voltages in advance and sequentially apply the candidate values of the determination voltages of each set to execute the read processing plural times. When the error correction is unsuccessful in any of the plural read processes, the memory controller 10 may determine to optimize the determination voltages. When the error correction is successful in any of the plural read processes, the memory controller 10 may determine not to optimize the determination voltages.

When determining to optimize the determination voltages ("Yes" in S103), the memory controller 10 acquires new setting values of the determination voltages VA to VG by executing a search (S104). That is, the memory controller 10 obtains the optimum values of the determination voltages VA to VG by executing distribution read or the like, and sets the obtained optimum values of the determination voltages VA to VG as new setting values of the determination voltages VA to VG.

Thereafter, the memory controller 10 instructs the peripheral circuit 21 to retry the read processing (S105). In S105, the memory controller 10 uses the new setting values of the determination voltages VA to VG obtained by the process of S104 to execute the read processing.

When the peripheral circuit 21 acquires data by the read processing of S105, the memory controller 10 executes error correction on the data (S106). Then, the memory controller 10 determines whether or not the error correction is successful (S107).

When the error correction is successful ("Yes" in S107), the compression circuit 40 compresses the new setting values of the determination voltages VA to VG (S108). The memory controller 10 stores the determination voltage information 32 indicating the compressed new setting values of the determination voltages VA to VG output from the compression circuit 40 in the management area 31 (S109). Then, it is determined whether or not the read processing is to be executed again (S110).

When it is determined that the read processing is to be executed again ("Yes" in S110), the decompression circuit 50 decompresses the determination voltage information 32 stored in the management area 31 to obtain the setting values of the determination voltages VA to VG (S111). The memory controller 10 instructs the peripheral circuit 21 to execute the read processing by using the new setting values of the determination voltages VA to VG obtained by the decompression (S112). Then, the control proceeds to S102.

When it is determined not to optimize the determination voltages ("No" in S103), when the error correction is unsuccessful ("No" in S107), or when the read processing is not to be executed again ("No" in S110), the memory system 1 ends the operation.

The operation described with reference to FIG. 6 is merely an example. The timing and trigger conditions at which the compression circuit 40 executes the compression processing are not limited to the above example. Further, the timing and trigger conditions at which the decompression circuit 50 executes the decompression processing are not limited to the above example.

FIG. 7 is a flowchart illustrating an example procedure of the compression processing according to the first embodiment. First, the compression circuit 40 selects reference values from the setting values of the determination voltages VA to VG (S201). For example, the compression circuit 40 selects the setting value of the determination voltage VA and the setting value of the determination voltage VG as the reference values.

Subsequently, the compression circuit 40 executes the first processing (S202). That is, based on the two reference values selected in S201, the compression circuit 40 calculates the estimated values of the setting values of the determination voltages excluding the reference values (i.e., the setting values of the determination voltages VB to VF). For example, the compression circuit 40 calculates the estimated values of the setting values of the determination voltages VB to VF by linearly interpolating the range between the two reference values.

Subsequently, the compression circuit 40 executes the second processing (S203). That is, the compression circuit 40 calculates a difference value between the estimated value and the setting value for each of the determination voltages VB to VF.

Subsequently, the compression circuit 40 outputs a set of the two reference values (i.e., the setting value of the determination voltage VA and the setting value of the determination voltage VG) and the difference value calculated for each of the determination voltages VB to VF as the determination voltage information 32 (S204). The compression processing is completed by S204.

FIG. 8 is a flowchart illustrating an example procedure of the decompression processing according to the first embodiment. First, the decompression circuit 50 acquires the reference values and the difference values from the determination voltage information 32 (S301). For example, the decompression circuit 50 acquires the setting values of the determination voltages VA and VG included in the determination voltage information 32 as the reference values, and acquires the difference values for the determination voltages VB to VF included in the determination voltage information 32.

Subsequently, the decompression circuit 50 executes the third processing (S302). That is, based on the two reference values acquired in S301, the decompression circuit 50 calculates the estimated values of the setting values of the determination voltages excluding the reference values (i.e., the setting values of the determination voltages VB to VF). For example, the decompression circuit 50 calculates the estimated values of the setting values of the determination voltages VB to VF by linearly interpolating the range between the two reference values.

Subsequently, the decompression circuit 50 executes the fourth processing (S303). That is, the decompression circuit 50 calculates the setting values of the determination voltages excluding the reference values (i.e., the setting values of the determination voltages VB to VG) by adding the difference value and the estimated value for each of the determination voltages VB to VG.

Then, the decompression circuit 50 collectively outputs the setting values of the determination voltages VA and VG acquired as the reference values and the setting values of the determination voltages VB to VG acquired in S303 (S304). The decompression processing is completed by S304.

As described above, according to the first embodiment, the compression circuit 40 uses the setting values of the two determination voltages VA and VG among the setting values of the determination voltages VA to VG as the reference values to execute the first processing that includes calculating the estimated value of the setting value for each of the determination voltages VB to VF. Thereafter, the compression circuit 40 executes the second processing that includes calculating the difference value between the setting value and the estimated value for each of the determination voltages VB to VF. For each of the determination voltages VB to VF, a difference value, not a setting value, is stored in the management area 31.

With this configuration, it is possible to reduce the size of information to be stored for each of the determination voltages VB to VF. That is, it becomes possible to efficiently store the setting values of the determination voltages.

It has been shown that the setting values selected as the reference values are included in the determination voltage information 32 in the state of direct values. The setting values selected as the reference values may be included in the determination voltage information 32 as difference values from predetermined values instead of the state of direct values.

Further, according to the first embodiment, the decompression circuit 50 acquires the setting values of the two determination voltages VA and VG included in the determination voltage information 32 as the reference values, and calculates the estimated value of the setting value for each of the determination voltages VB to VF by executing the third processing, which is the same as the first processing, using the two reference values. Thereafter, for each of the determination voltages VB to VF, based on the difference values for the determination voltages VB to VF included in the determination voltage information 32 and the estimated values of the setting values of the determination voltages VB to VF obtained by the third processing, the decompression circuit 50 executes the fourth processing that includes calculating the setting value for each of the determination voltages VB to VF.

In the decompression processing, the same values as the estimated values used in the compression processing are used for each of the determination voltages VB to VF. Therefore, the same values as the setting values before the compression are obtained by the decompression processing for each of the determination voltages VB to VF. That is, it is possible to perform lossless compression/decompression for the setting values of the determination voltages VB to VF.

Second Embodiment

In the first embodiment, the setting values of the determination voltages VA and VG among the setting values of the determination voltages VA to VG are selected as the reference values. That is, in the first embodiment, the maximum value and the minimum value among the setting values of the determination voltages VA to VG are selected as the reference values. The method of selecting the reference values is not limited thereto.

Figure 9:
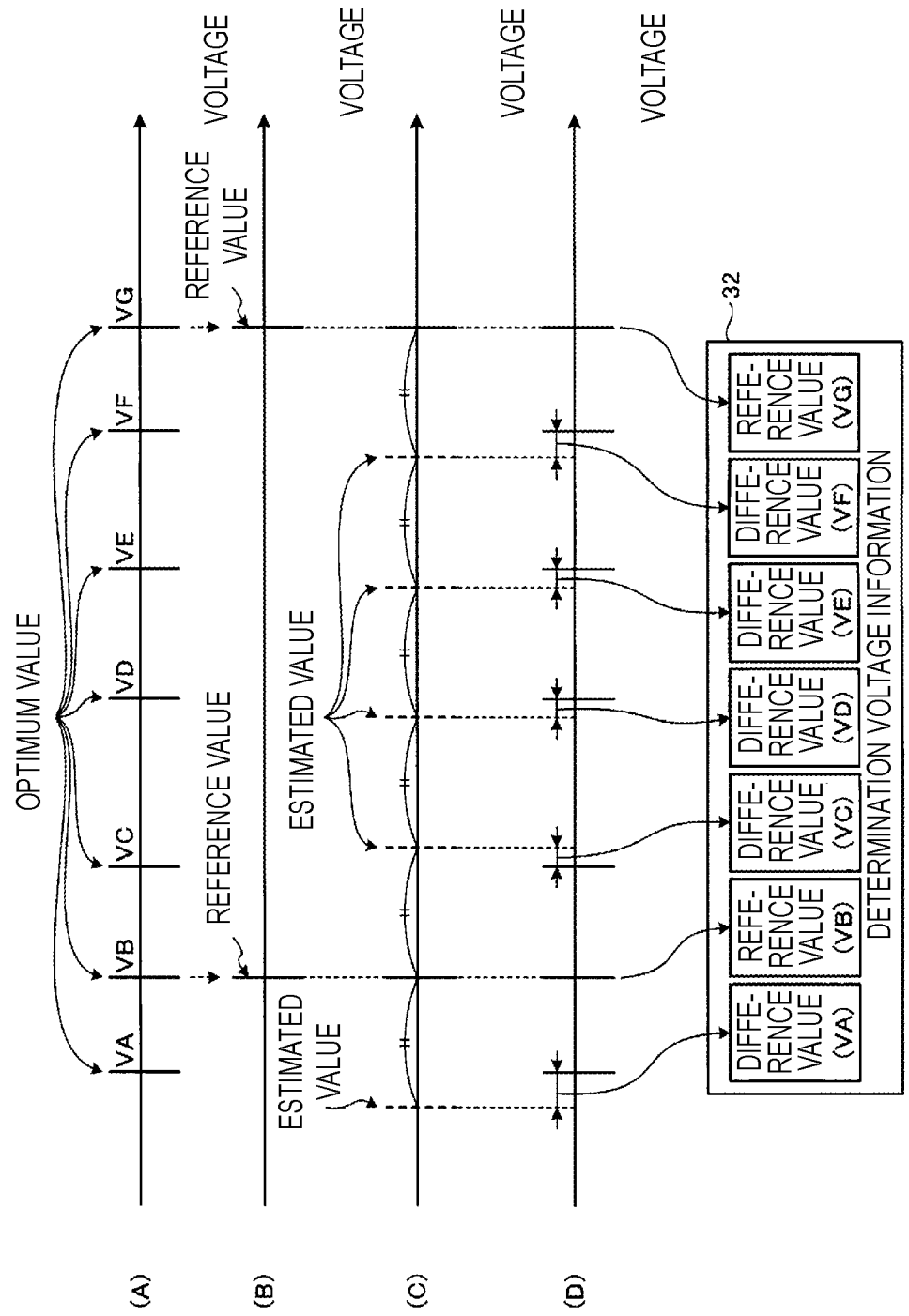
FIG. 9 is a diagram for explaining specific examples of first processing and third processing according to a second embodiment.

FIG. 9 is a diagram for explaining specific examples of the first processing and the third processing according to a second embodiment. According to the example illustrated in FIG. 9, the setting values of the determination voltages VB and VG are selected as the reference values (see part (A) and (B) of FIG. 9). That is, in the second embodiment, the maximum value and the second smallest value among the setting values of the determination voltages VA to VG are selected as the reference values.

Then, in the first processing, the estimated values of the setting values of the determination voltages VC to VF are calculated by interpolating between the two reference values on the assumption that the setting values of the determination voltages VA to VG are present at equal intervals (see part (C) of FIG. 9). That is, the estimated values of the setting values of the determination voltages VC to VF are calculated by linearly interpolating a range between the setting value of the determination voltage VB and the setting value of the determination voltage VG.

Further, in the first processing, the estimated value of the setting value of the determination voltage VA located on the negative side of the range between the two reference values is calculated on the assumption that the setting values of the determination voltages VA to VG are present at equal intervals (see part (C) of FIG. 9). That is, the estimated value of the setting value of the determination voltage VA is calculated by extrapolating outside the range between the setting value of the determination voltage VB and the setting value of the determination voltage VG. At this time, when the estimated value of the setting value of the determination voltage VA becomes less than the minimum value of a settable voltage, the determination voltage VA may be clipped to the minimum settable voltage.

In the second processing, a difference value between the optimum value and the estimated value for each of the determination voltages VA and VC to VF is calculated (see part (D) of FIG. 9). Then, the difference values between the two reference values, that is, the optimum values of the determination voltages VB and VG, and the corresponding estimated value obtained for each of the determination voltages VA and VC to VF are recorded in the determination voltage information 32 which is then output.

For example, a case is considered where the respective values of the determination voltages VA to VG may be set within the range of 0 to 511 (9 bits) and the setting values of the determination voltages VA to VG are set to {30, 90, 155, 235, 295, 370, 420}. In the example of FIG. 9, in the first processing, the setting value of 90 of the determination voltage VB and the optimum value of 420 of the determination voltage VG are respectively selected as the reference values. Then, by dividing the range of 30 to 420 by 5, 66 is obtained as the interval between estimated values. Then, by arranging the estimated values of the determination voltages VC to VF at intervals of 66, {156, 222, 288, 354} is obtained as the estimated values of the determination voltages VC to VF.

In the first processing, further, by arranging the estimated value of the determination voltage VA at the interval of 66 in the negative direction from the setting value of 90 of the determination voltage VB, 24 is obtained as the estimated value of the determination voltage VA. That is, the estimated values of the determination voltages VA and VC to VF are obtained as {24, 156, 222, 288, 354}.

In the second processing, the difference value is calculated for each of the determination voltages VA and VC to VF to obtain {6, −1, 13, 7, 16} as the difference values for the determination voltages VA and VC to VF.

Then, the determination voltage information 32 in which the setting values {90, 420} of the determination voltages VB and VG as the reference values and the difference values {6, −1, 13, 7, 16} for the determination voltages VA and VC to VF are recorded is output.

In the third processing, the setting values {90, 420} of the determination voltages VB and VG are obtained as the reference values from the determination voltage information 32, and the estimated values {24, 156, 222, 288, 354} of the determination voltages VA and VC to VF are obtained by the same processing as the first processing based on these reference values.

In the fourth processing after the third processing, the estimated values {24, 156, 222, 288, 354} of the determination voltages VA and VC to VF and the difference values {6, −1, 13, 7, 16} for the determination voltages VA and VC to VF included in the determination voltage information 32 are added to obtain the direct values {30, 155, 235, 295, 370} of the setting values of the determination voltages VA and VC to VF.

Then, the setting values {90, 420} of the determination voltages VB and VG and the direct values {30, 155, 235, 295, 370} of the setting values of the determination voltages VA and VC to VF are output as the setting values of the determination voltages VA to VG.

Since the respective values of the determination voltages VA to VG may be set within a range of 0 to 511 (9 bits), when storing the optimum values of the determination voltages VA to VG as they are, the size of information to be stored is 63 bits (=7*9 bits). In the meantime, as in the first embodiment, the size of the difference value is within 5 bits. Therefore, it is possible to reduce the size of the determination voltage information 32 indicating the optimum values of the determination voltages VA to VG to 43 bits (=2*9 bits+5*5 bits).

In this way, in the second embodiment, the setting values of the determination voltages VB and VG among the setting values of the determination voltages VA to VG are respectively set as the reference values.

Since the determination voltage VA, which is a determination voltage at which the minimum value is set among one set of determination voltages VA to VG is set, is closest to the distribution Er corresponding to the erased state, the behavior thereof may be different from those of other determination voltages. In that case, when the setting value of the determination voltage VA is selected as the reference value, there is a possibility that the deviation amount (difference value) between the setting value and the estimated value becomes large with respect to the setting values other than the reference value. When the deviation amount (difference value) between the setting value and the estimated value becomes large, the size required for storing the difference value increases.

In the second embodiment, since the setting value of the determination voltage VB is selected as the reference value instead of the setting value of the determination voltage VA, the deviation amount (difference value) between the setting value and the estimated value can be reduced. As a result, it is possible to prevent the size required for storing the difference value from increasing.

In the second embodiment, the setting values of the determination voltages VB and VG among the setting values of the determination voltages VA to VG are set as the reference values. The method of selecting the reference values, however, is not limited thereto. Any two of the setting values of the determination voltages VA to VG may be selected as the reference values.

Third Embodiment

The difference value calculating method executed in the second processing is not limited to the methods described in the first and second embodiments. In the second processing, for example, the difference values may be calculated by a process described below.

In the second process, the compression circuit 40 calculates the difference value of each setting value between the reference values in a preset ascending or descending order of voltage values. Then, when calculating the difference value of each setting value between the reference values or outside the reference values, the compression circuit 40 corrects the difference value of each setting value using a correction amount obtained by a predetermined method and then outputs the corrected difference value. Here, the compression circuit 40 uses, as the correction amount, a value obtained by integrating the difference value for each setting value, obtained after the calculation of the difference value of each setting value between the reference values or outside the reference values is started.

For example, in the first embodiment, when the setting values of the determination voltages VA to VG are {30, 90, 155, 235, 295, 370, 420}, {95, 160, 225, 290, 355} are obtained as the estimated values of the setting values of the determination voltages VB to VF, and {−5, −5, 10, 5, 15} are obtained as the difference values for the determination voltages VB to VF.

In the third embodiment, assuming that a difference value is calculated in the order of, for example, VB, VC, VD, VE, and VF, the compression circuit 40 first calculates the difference value for the determination voltage VB in the same manner as in the first embodiment to obtain −5 as the difference value for the determination voltage VB.

Next, the compression circuit 40 corrects the difference value between the setting value of the determination voltage VC and the estimated value of the determination voltage VC with the difference value of −5 for the determination voltage VB as a correction amount, and obtains a value obtained by the correction as the difference value for the determination voltage VC. That is, the compression circuit 40 subtracts 160, which is the estimated value of the determination voltage VC, from the setting value of 155 of the determination voltage VC, and subtracts −5, which is the correction amount, from −5 which is a value obtained by subtraction. The compression circuit 40 obtains 0, which is a value obtained by the subtraction of the correction amount, as the difference value for the determination voltage VC.

Next, the compression circuit 40 uses −5, which is the sum of −5 which is the difference value for the determination voltage VB and 0 which is the difference value for the determination voltage VC, as the correction amount to calculate the difference value for the determination voltage VD. That is, the compression circuit 40 subtracts 225, which is an estimated value of the determination voltage VD, from the setting value 235 of the determination voltage VD, and subtracts −5, which is the correction amount, from 10 which is a value obtained by the subtraction. The compression circuit 40 obtains 15, which is a value obtained by the subtraction of the correction amount, as the difference value for the determination voltage VD.

Next, the compression circuit 40 uses 10, which is the sum of −5 which is the difference value for the determination voltage VB, 0 which is the difference value for the determination voltage VC and 15 which is the difference value for the determination voltage VD, as the correction amount to calculate the difference value for the determination voltage VE. That is, the compression circuit 40 subtracts 290, which is an estimated value of the determination voltage VE, from the setting value of 295 of the determination voltage VE, and subtracts 10, which is the correction amount, from 5 which is a value obtained by the subtraction. The compression circuit 40 obtains −5, which is a value obtained by the subtraction of the correction amount, as the difference value for the determination voltage VE.

Next, the compression circuit 40 uses 5, which is the sum of −5 which is the difference value for the determination voltage VB, 0 which is the difference value for the determination voltage VC, 15 which is the difference value for the determination voltage VD, and −5 which is the difference value for the determination voltage VE, as the correction amount to calculate the difference value for the determination voltage VF. That is, the compression circuit 40 subtracts 355, which is an estimated value of the determination voltage VE, from the setting value of 370 of the determination voltage VF, and subtracts 5, which is the correction amount, from 15 which is a value obtained by the subtraction. The compression circuit 40 obtains 10, which is a value obtained by the subtraction of the correction amount, as the difference value for the determination voltage VF.

That is, the compression circuit 40 may obtain {−5, 0, 15, −5, 10} as the difference values for the determination voltages VB to VF.

In this example, it is assumed that the difference values are calculated in the order of VB, VC, VD, VE, and VF. The difference values may be calculated in an order reverse to the voltage order, that is, in an order of VF, VE, VD, VC, and VB. In that case, when calculating each difference value, the compression circuit 40 may use the sum of the difference values calculated before that point as the correction amount.

In the fourth processing, the decompression circuit 50 executes a process reverse to the above-described second processing.

Specifically, the decompression circuit 50 calculates the correction amount for the determination voltages VB to VF in the ascending or descending order of voltage values in which the compression circuit 40 calculates the correction amount. Then, when calculating each setting value between the reference values, the decompression circuit 50 applies the difference value of each setting value after correcting the difference value with the previously obtained correction amount.

For example, a case is considered where the difference values for the determination voltages VB to VF are {−5, 0, 15, −5, 10}, the estimated values of the setting values of the determination voltages VB to VF are {95, 160, 225, 290, 355}, and the difference values for the determination voltages VB to VF are calculated in the order of voltages.

The decompression circuit 50 uses −5, which is the difference value for the determination voltage VB, as a correction amount when calculating the setting value of the determination voltage VC. The decompression circuit 50 uses −5, which is the sum of the difference value of −5 for the determination voltage VB and the difference value of 0 for the determination voltage VC, as a correction amount when calculating the setting value of the determination voltage VD. The decompression circuit 50 uses 10, which is the sum of the difference value of −5 for the determination voltage VB, the difference value of 0 for the determination voltage VC, and the difference value of 15 for the determination voltage VD, as a correction amount when calculating the setting value of the determination voltage VE. The decompression circuit 50 uses 5, which is the sum of the difference value of −5 for the determination voltage VB, the difference value of 0 for the determination voltage VC, the difference value of 15 for the determination voltage VD, and the difference value of −5 for the determination voltage VE, as a correction amount when calculating the setting value of the determination voltage VF.

The decompression circuit 50 obtains the setting value by adding the correction amount and the difference value to the estimated value.

The decompression circuit 50 calculates the setting values of the determination voltages VC to VF by the same method used for the setting value of the determination voltage VB. However, the decompression circuit 50 uses {−5, 10, 5, 15} as the correction amounts for the determination voltages VC to VF.

When the setting values of the determination voltages VA to VG are {30, 90, 155, 235, 295, 370, 420} and the estimated values of the setting values of the determination voltages VB to VF are {95, 160, 225, 290, 355}, the compression circuit 40 obtains {−5, 0, 15, −5, 10} as the difference values for the determination voltages VB to VF. The compression circuit 40 may multiply the even or odd difference values by −1 so that as many of the difference values for the determination voltages VB to VF have the same sign as possible. For example, the compression circuit 40 may perform the second correction of adding −1 to the difference values of the determination voltages VC and VE and may output the obtained {−5, 0, 15, 5, 10} as the difference values for the determination voltages VB to VF.

In this way, the difference value between the estimated value and the setting value may be stored after being corrected.

Fourth Embodiment 3-bit data is stored in each memory cell MT in the first to third embodiments. The techniques of the first to third embodiments may also be applied to a case where data of plural bits other than 3 bits is stored in each memory cell MT.

For example, when data of N bits (N is a natural number of 2 or more) is stored in each memory cell MT, one set of determination voltages includes ($2^N$−1) determination voltages. When N is 2, one set of determination voltages includes three determination voltages. Since N may be 2 or more, the number of determination voltages is 3 or more.

The compression circuit 40 selects two of the setting values of the ($2^N$−1) determination voltages as the reference values, calculates the estimated values of the setting values by interpolation of the range between the two reference values or by extrapolation outside the range, and calculates a difference value between the estimated value and the setting value.

The setting values of two determination voltages are selected as the reference values in the first to third embodiments. Three or more setting values may be selected as the reference values. The compression circuit 40 and the decompression circuit 50 may calculate estimated values of setting values other than the reference values by interpolation or extrapolation using three or more reference values.

In addition, as the proportion of the setting values stored as the difference values among the setting values of one set of determination voltages increases, the compression rate may be increased. That is, it is possible to achieve the maximum compression rate by setting only the setting values of two determination voltages as the reference values.

In the first to third embodiments, as an example, each estimated value is calculated on the assumption that the setting values are present at equal intervals. Each estimated value may be calculated on the assumption that the interval between the setting values is a predetermined ratio. That is, the compression circuit 40 and the decompression circuit 50 may calculate an estimated value of each setting value between the reference values by dividing the interval between the reference values at any ratio, or may calculate an estimated value for a setting value outside the range between the reference values by extrapolating using a value different from the interval of each setting value between the reference values. An algorithm of calculating an estimated value and an arithmetic expression of calculating an estimated value may be designed as desired.

In addition, in the first to third embodiments, as one example, the determination voltage information 32 is stored in the management area 31 provided in the RAM 30. The position where the determination voltage information 32 is stored is not limited to the RAM 30. The determination voltage information 32 may be stored in the NAND memory 20.

In addition, a technique of providing an area that may be used by a device in a memory built in a host is known. The technique is standardized, for example, as one of UFS (Universal Flash Storage) standards. The determination voltage information 32 may be stored in an area allocated to the memory built in the host 2 and usable by the memory system 1.

Further, the memory cell array 22 has the configuration in which the memory cells MT are two-dimensionally arranged in the first to third embodiments. The memory cell array 22 may have a configuration in which the memory cells MT are three-dimensionally arranged. In that case, for example, a stacked body in which a conductive film and an insulating film are alternately stacked may be penetrated by a columnar semiconductor pillar and a memory cell MT may be formed in a portion where the conductive film and the semiconductor pillar intersect.

Fifth Embodiment

The compression circuit 40 and the decompression circuit 50 may be provided in any constituent element of the memory system 1. A fifth embodiment will be described with three examples of the configuration of the compression circuit 40 and the decompression circuit 50 with reference to FIGS. 10 to 12.

Figure 10:
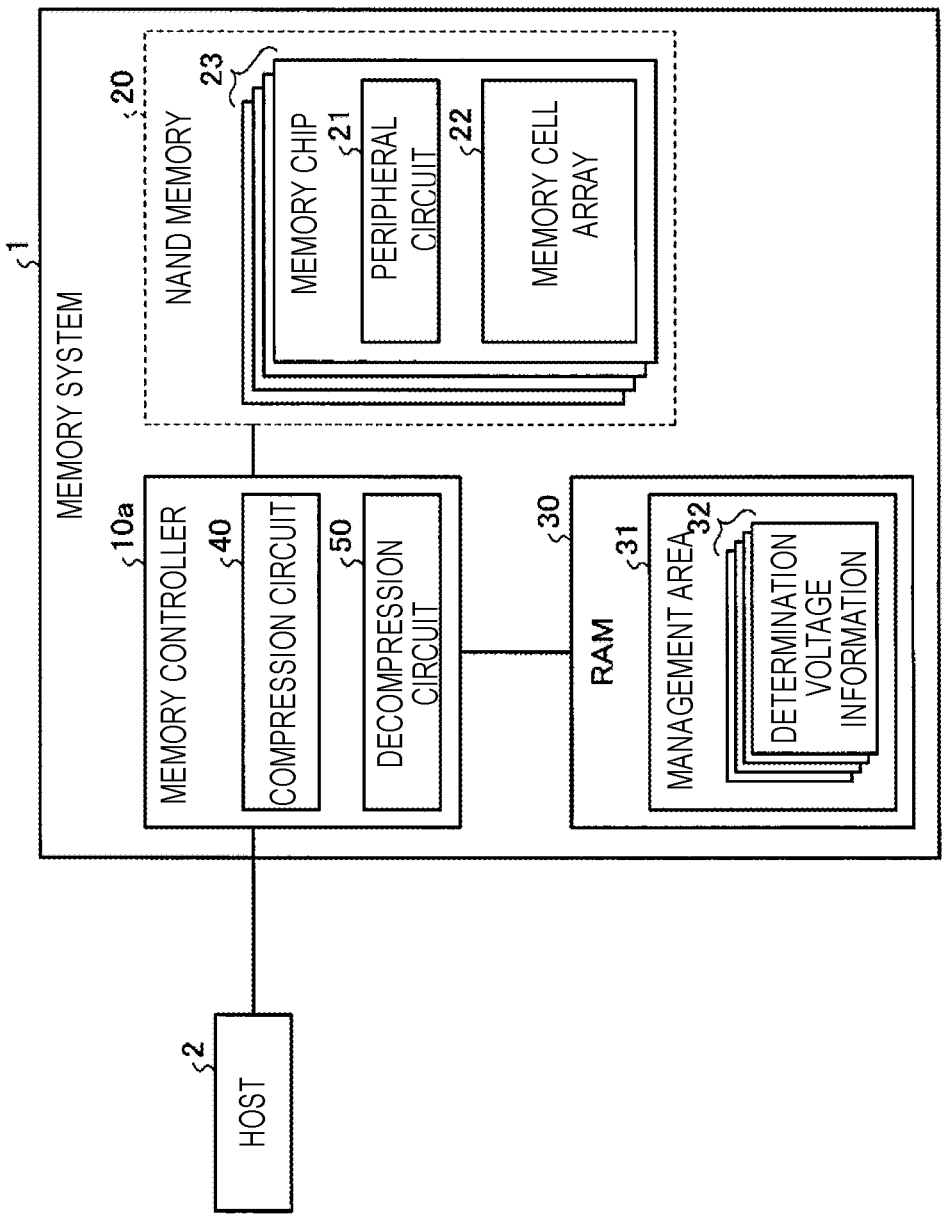
FIG. 10 illustrates a configuration example of a compression circuit and a decompression circuit according to a fifth embodiment.

According to the example illustrated in FIG. 10, a memory controller 10a is connected to the RAM 30 and the NAND memory 20. Further, the memory controller 10 is connected to the host 2.

The NAND memory 20 includes plural memory chips 23 each including a peripheral circuit 21 and a memory cell array 22.

The compression circuit 40 and the decompression circuit 50 are both provided in the memory controller 10.

The memory controller 10 searches for the optimum value (setting value) of a determination voltage and compresses the obtained optimum value (setting value) of the determination voltage with the compression circuit 40. Then, the memory controller 10 stores the determination voltage information 32 obtained by the compression in the management area 31 in the RAM 30.

The memory controller 10 uses the compressed setting value of the determination voltage to read the determination voltage information 32 from the management area 31. Then, the memory controller 10 obtains the setting value of the determination voltage by decompressing the read determination voltage information 32 with the decompression circuit 50. The memory controller 10 transmits the setting value of the determination voltage obtained by the decompression to the memory chip 23 and instructs the peripheral circuit 21 to perform read processing using the setting value of the determination voltage obtained by the decompression.

Figure 11:
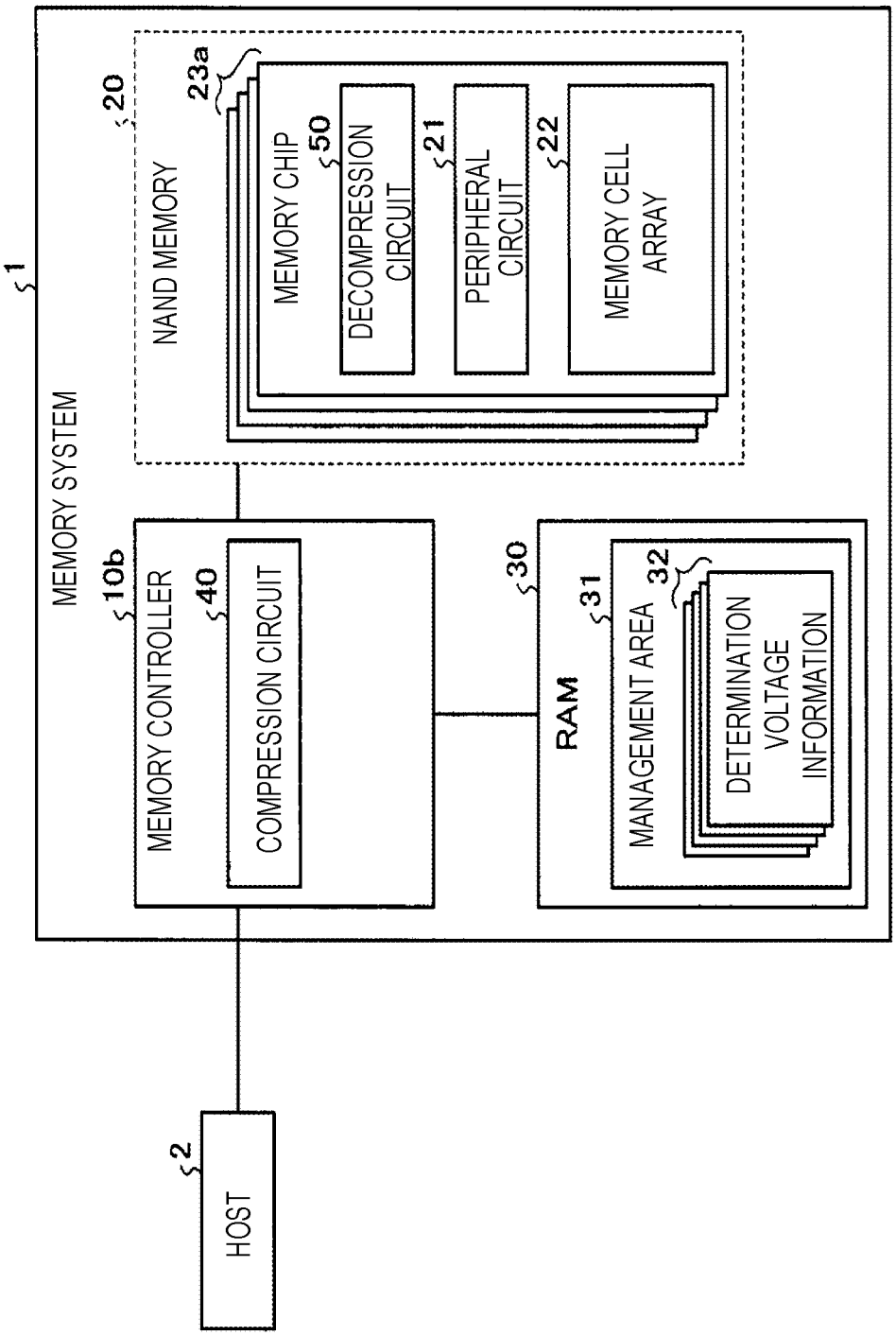
FIG. 11 illustrates another configuration example of the compression circuit and the decompression circuit according to the fifth embodiment.

The example illustrated in FIG. 11 is different from the example illustrated in FIG. 10 in that the decompression circuit 50 is provided in each memory chip 23a. According to the example illustrated in FIG. 11, a memory controller 10b compresses the setting value of the determination voltage with the compression circuit 40 included therein and stores the determination voltage information 32 obtained by the compression in the management area 31 in the RAM 30.

If the memory controller 10 uses the compressed setting value of the determination voltage, the memory controller 10 reads the determination voltage information 32 from the management area 31, and transmits the determination voltage information 32 to the memory chip 23. Upon receiving the determination voltage information 32, the memory chip 23 decompresses the determination voltage information 32 into the setting value of the determination voltage with the decompression circuit 50 included therein and uses the setting value of the determination voltage obtained by the decompression.

Figure 12:
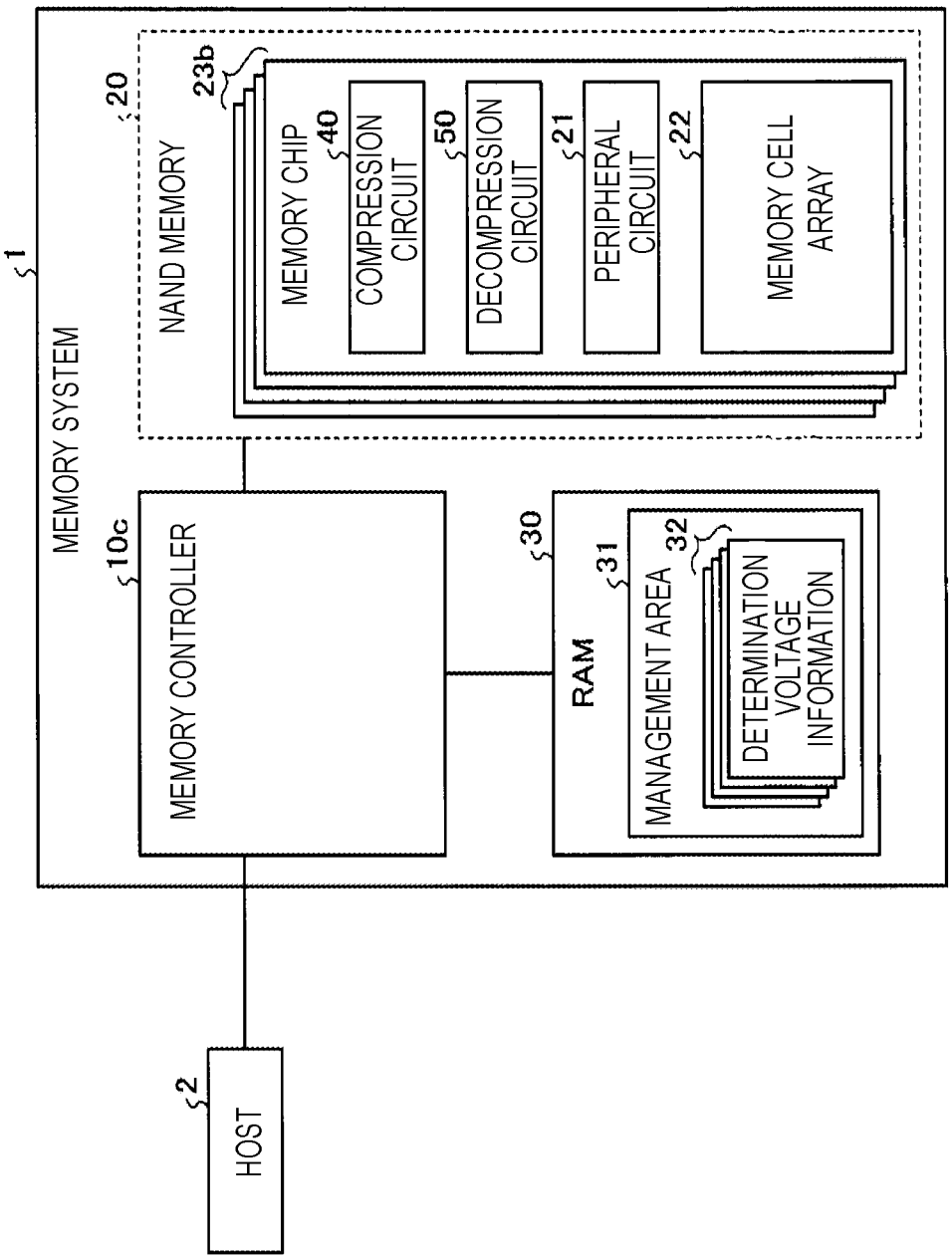
FIG. 12 illustrates still another configuration example of the compression circuit and the decompression circuit according to the fifth embodiment.

The example illustrated in FIG. 12 is different from the example illustrated in FIG. 10 in that the compression circuit 40 and the decompression circuit 50 are provided in each memory chip 23b.

According to the example illustrated in FIG. 12, for example, the peripheral circuit 21 performs a process of searching for the optimum value of a determination voltage based on an instruction from a memory controller 10c. The memory chip 23 compresses the obtained optimum value of the determination voltage with the compression circuit 40 included therein and transmits the determination voltage information 32 obtained by the compression to the memory controller 10. Upon receiving the determination voltage information 32 from the memory chip 23, the memory controller 10 stores the received determination voltage information 32 in the management area 31 in the RAM 30.

If the memory controller 10 uses the compressed setting value of the determination voltage, the memory controller 10 reads the determination voltage information 32 from the management area 31, and transmits the determination voltage information 32 to the memory chip 23. Upon receiving the determination voltage information 32, the memory chip 23 decompresses the determination voltage information 32 into the setting value of the determination voltage with the decompression circuit 50 included therein and uses the setting value of the determination voltage obtained by the decompression.

In this way, the compression circuits 40 and the decompression circuits 50 shown in the first to fourth embodiments may be arranged as desired.

As described in the first to fifth embodiments, the compression circuit 40 uses, as the reference values, two or more of the setting values of plural determination voltages to execute the first processing that includes calculating the estimated value of the setting value for each of the plural determination voltages. Thereafter, the compression circuit 40 executes the second processing that includes calculating a difference value between the setting value and the estimated value for each of the setting values of the determination voltages different from the reference values. The difference values for the determination voltages different from the reference values are stored in the management area 31.

Thus, it is possible to efficiently store the setting values of the determination voltages.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a first memory including a memory cell array including memory cell transistors, and a peripheral circuit configured to read data of a plurality of bits stored in a memory cell transistor of the memory cell array based on a comparison between threshold voltages of the memory cell transistor and at least a part of n determination voltages ($n \geq 3$);
a first circuit configured to calculate an estimated value of each of n−m determination voltages based on values of m determination voltages ($2 \leq m \leq n-1$) among the n determination voltages, and calculate a difference between a value of each of the n−m determination voltages and a corresponding estimated value;
a second memory configured to store values of the m determination voltages and the difference for each of the n−m determination voltages; and
a second circuit configured to calculate an estimated value of each of n−m determination voltages based on the values of the m determination voltages read from the second memory, and calculate a value of each of n−m determination voltages based on a corresponding estimated value calculated thereby and a corresponding difference read from the second memory, respectively.

2. The memory system according to claim 1, further comprising a memory controller configured to:
carry out error correction processing with respect to data read from the memory cell transistor, and
cause the first circuit to perform calculation of the estimated value of each of the n−m determination voltages and the difference for each of the n−m determination voltage, based on a result of the error correction processing.

3. The memory system according to claim 2, wherein the memory controller is further configured to:
update values of the n determination voltages by shifting a value of at least part of the n determination voltages, when the error correction processing is unsuccessful, and
cause the first circuit to perform calculation of the estimated value of each of the n−m determination voltages and the difference for each of the n−m determination voltage, using updated values of the n determination voltages.

4. The memory system according to claim 2, wherein the first circuit is integrated with the memory controller.

5. The memory system according to claim 2, wherein the first circuit is externally provided from the first memory, the second memory, and the memory controller.

6. The memory system according to claim 1, wherein the first circuit is integrated with the first memory.

7. The memory system according to claim 1, further comprising:
a memory controller configured to control the peripheral circuit to read the data of the plurality of bits stored in the memory cell transistor of the memory cell array, using the value of each of the n−m determination voltages calculated by the second circuit and the values of the m determination voltages read from the second memory.

8. The memory system according to claim 7, wherein any one of the first circuit and the second circuit is integrated with the memory controller.

9. The memory system according to claim 7, wherein any one of the first circuit and the second circuit is externally provided from the first memory, the second memory, and the memory controller.

10. The memory system according to claim 1, wherein any one of the first circuit and the second circuit is integrated with the first memory.

11. The memory system according to claim 1, wherein the first circuit is configured to calculate the estimated value of each of n−m determination voltages based on interpolation of the values of the m determination voltages.

12. The memory system according to claim 1, wherein the first circuit is configured to calculate the estimated value of each of n−m determination voltages based on extrapolation of the values of the m determination voltages.

13. A method of controlling a memory system comprising a first memory including a memory cell array including memory cell transistors, the method comprising:
determining values of n determination voltages (n≥3) to be used to read data of a plurality of bits stored in a memory cell transistor based on a comparison between threshold voltages of the memory cell transistor and at least a part of the n determination voltages;
calculating an estimated value of each of n−m determination voltages based on the values of m determination voltages (2≤m≤n−1) among the n determination voltages;
calculating a difference between a value of each of the n−m determination voltages and a corresponding estimated value;
storing, in memory, the values of the m determination voltages and the difference for each of the n−m determination voltages, without storing the determined values of the n−m determination voltages;
calculating an estimated value of each of n−m determination voltages based on the values of the m determination voltages stored in the memory; and
calculating a value of each of n−m determination voltages based on a corresponding estimated value calculated thereby and a corresponding difference stored in the memory, respectively.

14. The method of claim 13, further comprising:
carrying out error correction processing with respect to data read from the memory cell transistor, wherein
when the error correction processing is unsuccessful, the calculating the estimated value of each of the n−m determination voltages is carried out.

15. The method of claim 13, further comprising:
updating values of the n determination voltages by shifting a value of at least part of the n determination voltages, when the error correction processing is unsuccessful, wherein
the calculating the estimated value of each of the n−m determination voltages is carried out, using updated values of the n determination voltages.

16. The method of claim 13, further comprising:
reading data of the plurality of bits from the memory cell transistor, using the values of the m determination voltages stored in the second memory and the value of each of the n−m determination voltages calculated from the values of the m determination voltages stored in the second memory.

17. The method of claim 13, wherein the estimated value of each of n−m determination voltages is calculated based on interpolation of the values of the m determination voltages.

18. The method of claim 13, wherein the estimated value of each of n−m determination voltages is calculated based on extrapolation of the values of the m determination voltages.

* * * * *